US007968957B2

(12) United States Patent
Murthy et al.

(10) Patent No.: US 7,968,957 B2
(45) Date of Patent: Jun. 28, 2011

(54) TRANSISTOR GATE ELECTRODE HAVING CONDUCTOR MATERIAL LAYER

(75) Inventors: Anand Murthy, Portland, OR (US); Boyan Boyanov, Portland, OR (US); Suman Datta, Beaverton, OR (US); Brian S. Doyle, Portland, OR (US); Been-Yih Jin, Beaverton, OR (US); Shaofeng Yu, Plano, TX (US); Robert Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/893,983

(22) Filed: Sep. 29, 2010

(65) Prior Publication Data

US 2011/0018031 A1 Jan. 27, 2011

Related U.S. Application Data

(60) Division of application No. 12/553,033, filed on Sep. 2, 2009, now Pat. No. 7,871,916, which is a continuation of application No. 11/715,703, filed on Mar. 8, 2007, now Pat. No. 7,642,610, which is a division of application No. 10/745,978, filed on Dec. 24, 2003, now Pat. No. 7,223,679.

(51) Int. Cl.
*H01L 21/00* (2006.01)
(52) U.S. Cl. ............. 257/413; 257/E29.125; 257/412
(58) Field of Classification Search .......... 257/412–413, 257/E29.125; 438/585–595
See application file for complete search history.

(56) References Cited

U.S. PATENT DOCUMENTS

| 6,111,267 A | 8/2000 | Fischer et al. |
| 6,225,168 B1 * | 5/2001 | Gardner et al. ............. 438/287 |
| 6,326,667 B1 | 12/2001 | Sugiyama et al. |
| 6,407,406 B1 | 6/2002 | Tezuka |
| 6,632,710 B2 | 10/2003 | Takahashi |
| 6,911,384 B2 | 6/2005 | Dokumaci et al. |
| 7,223,679 B2 | 5/2007 | Murthy et al. |
| 7,642,610 B2 * | 1/2010 | Murthy et al. ............. 257/413 |
| 2002/0105015 A1 | 8/2002 | Kubo et al. |
| 2003/0227013 A1 | 12/2003 | Currie et al. |
| 2004/0023478 A1 | 2/2004 | Samavedam et al. |
| 2005/0087870 A1 | 4/2005 | Adetutu et al. |

OTHER PUBLICATIONS

A. Ritenour, et al., "Epitaxial Strained germanium p-MOSFET with HfO2 Gate Dielectrics and TaN Gate Electrode", International Electron Devices Meeting 2003, IEDM. Technical Digest, pp. 433-436.
D. Wu, et al., "A Novel Strained SiO.7GeO.3 Surface-Channel pMOSFET with an ALSTiN.Al203/HfAlOx/Al203 Gate Stack", IEEE Electron Device Letters, IEEE Inc., vol. 24, No. 3, Mar. 2003, pp. 171-173.

(Continued)

*Primary Examiner* — Richard A. Booth
(74) *Attorney, Agent, or Firm* — Blakely, Sokoloff, Taylor & Zafman LLP

(57) ABSTRACT

Various embodiments of the invention relate to a PMOS device having a transistor channel of silicon germanium material on a substrate, a gate dielectric having a dielectric constant greater than that of silicon dioxide on the channel, a gate electrode conductor material having a work function in a range between a valence energy band edge and a conductor energy band edge for silicon on the gate dielectric, and a gate electrode semiconductor material on the gate electrode conductor material.

20 Claims, 6 Drawing Sheets

OTHER PUBLICATIONS

Intel Corp., Office Action mailed May 7, 2008 in European Patent Application No. 04 815 678.0.

Intel Corp., First Office Action mailed Jun. 13, 2008 in PRC Patent Application No. 200480042095.5.

Intel Corp., *Non Final Office Action* mailed Aug. 22, 2006; U.S. Appl. No. 10/745,978.

Intel Corp., *Final Office Action* mailed Mar. 22, 2006; U.S. Appl. No. 10/745,978.

Intel Corp., *Non Final Office Action* mailed Aug. 10, 2005; U.S. Appl. No. 10/745,978.

Intel Corp., *Non Final Office Action* mailed Apr. 10, 2009; U.S. Appl. No. 11/715,703.

Intel Corp., *Non Final Office Action* mailed Aug. 2, 2010; U.S. Appl. No. 12/553,033.

* cited by examiner

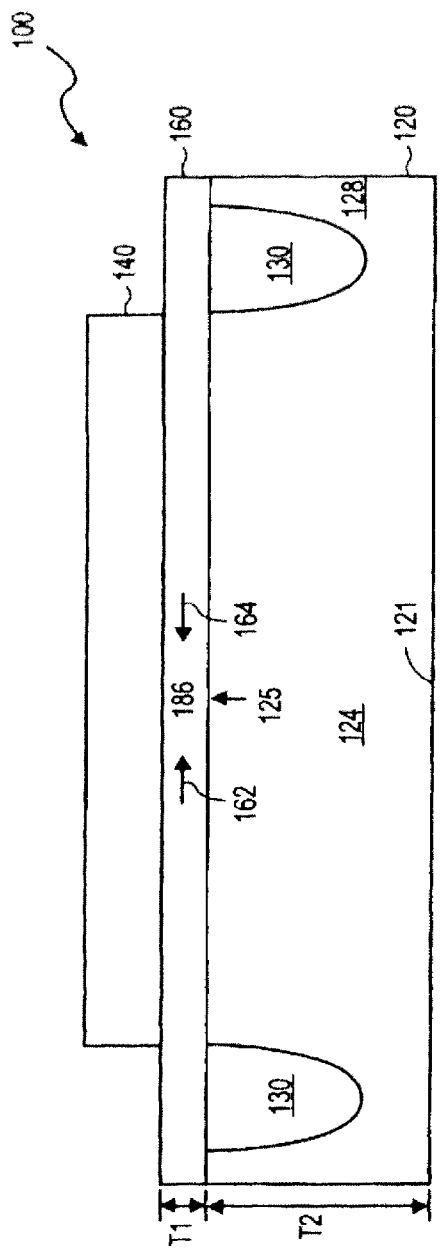
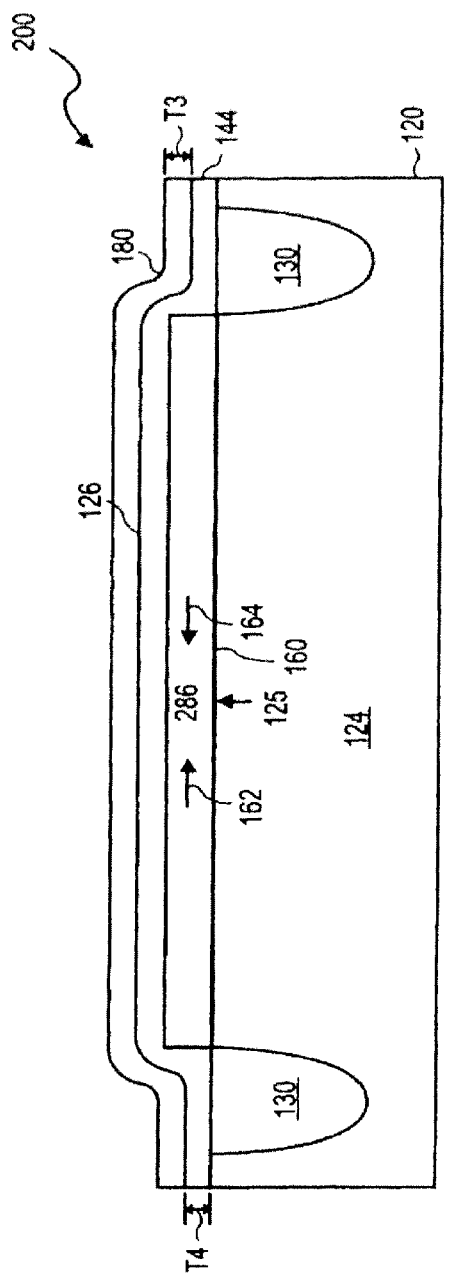

US 7,968,957 B2

TRANSISTOR GATE ELECTRODE HAVING CONDUCTOR MATERIAL LAYER

RELATED APPLICATIONS

This application is a divisional of U.S. patent application Ser. No. 12/553,033 filed Sep. 2, 2009 and issued as U.S. Pat. No. 7,871,916 on Jan, 18, 2011, which is a continuation of U.S. patent application Ser. No. 11/715,703 filed Mar. 8, 2007 and issued as U.S. Pat. No. 7,642,610 on Jan. 5, 2010, which is a divisional of U.S. patent application Ser. No. 10/745,978 filed Dec. 24, 2003 and issued as U.S. Pat. No. 7,223,679 on May 29, 2007.

FIELD

Circuit devices and the manufacture and structure of circuit devices.

BACKGROUND

Increased performance of circuit devices on a substrate (e.g., integrated circuit (IC) transistors, resistors, capacitors, etc. on a semiconductor (e.g., silicon) substrate) is typically a major factor considered during design, manufacture, and operation of those devices. For example, during design and manufacture or forming of metal oxide semiconductor (MOS) transistor semiconductor devices, such as those used in a complementary metal oxide semiconductor (CMOS), it is often desired to increase movement of electrons in N-type MOS device (NMOS) channels and to increase movement of positive charged holes in P-type MOS device (PMOS) channels. In addition, during such design, it is often also desired to reduce the depletion of carriers in an area of the NMOS and PMOS device gate electrodes near the gate dielectrics during inversion, while minimizing parasitic resistance, and providing an appropriately large threshold or "ON" voltage.

BRIEF DESCRIPTION OF THE DRAWINGS

Embodiments are illustrated by way of example and not by way of limitation in the figures of the accompanying drawings in which like references indicate similar elements. It should be noted that references to "an" embodiment in this disclosure are not necessarily to the same embodiment, and they mean at least one.

FIG. 1 is a schematic cross section view of a portion of a substrate having a layer of silicon germanium material on the substrate.

FIG. 2 is the schematic substrate of FIG. 1 after etching the layer of silicon germanium material, and forming a layer of gate dielectric material and gate electrode conductor material on the etched silicon germanium material.

DETAILED DESCRIPTION

Figure 3:
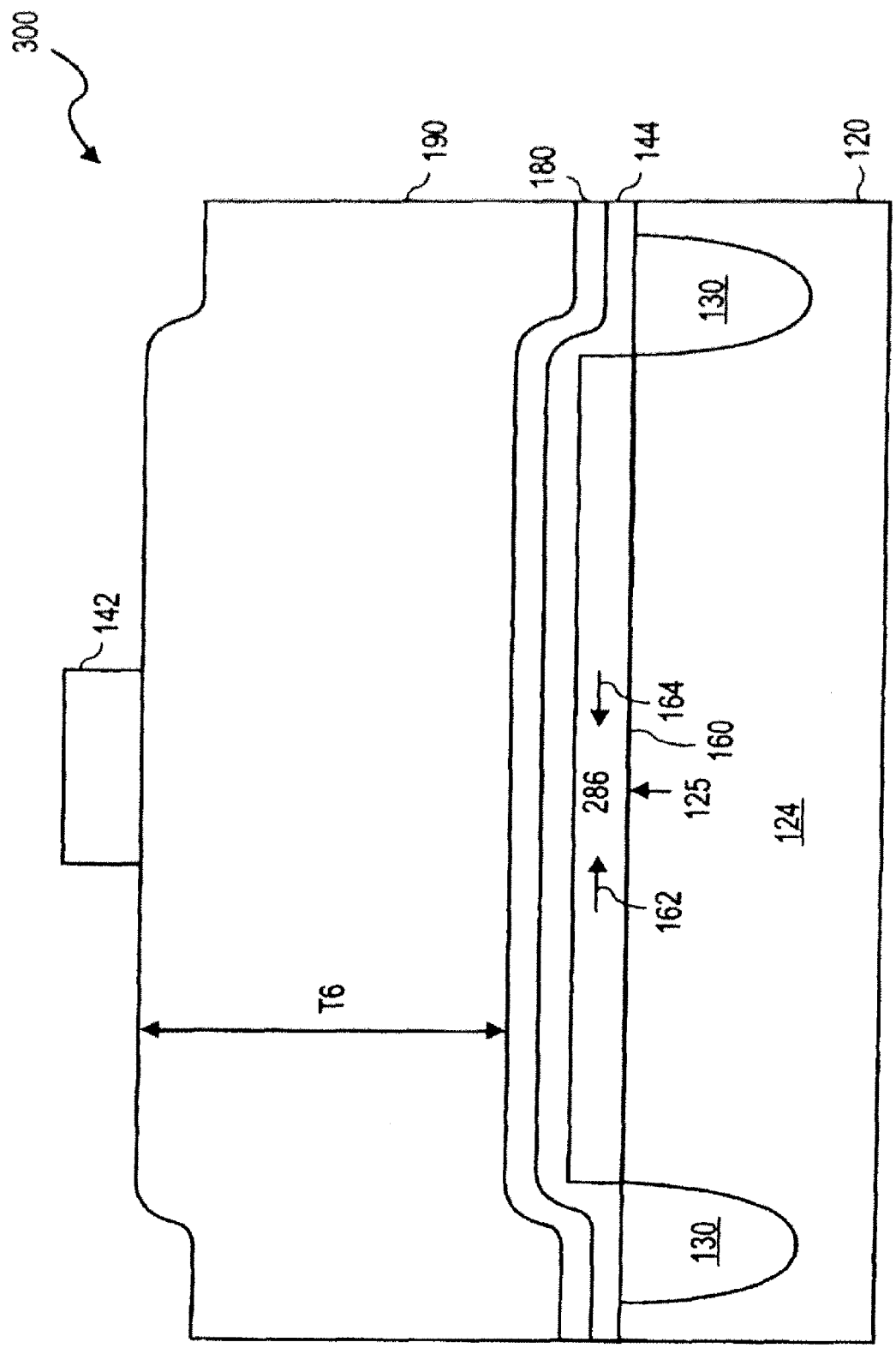
FIG. 3 shows the substrate of FIG. 2 after forming a layer of gate electrode semiconductor material on the layer of gate electrode conductor material.

FIG. 1 is a schematic cross section view of a portion of a substrate having a layer of silicon germanium material on the substrate. FIG. 1 shows channel layer 160 on top of substrate layer 120 having electrically insulating material 130 between a first area of the substrate layer, such as N-type well 124 and surrounding region 128. For example, substrate layer 120 may include, be formed from, deposited with, or grown from polycrystalline silicon, single crystal silicon, or various other suitable technologies for forming a silicon base or substrate, such as a silicon wafer. For example, according to embodiments, substrate layer 120 may be formed by growing a single crystal silicon substrate base material having thickness T2 of between 100 angstroms and 1,000 angstroms of pure silicon. Alternatively, substrate layer 120 may be formed by sufficient CVD of various appropriate silicon or silicon alloy materials to form a graded relaxed layer of material having thickness T2 between one and three micrometers in thickness, such as by CVD to form substrate layer 120 having a thickness T2 of 2 micrometers in thickness. It is also considered that substrate layer 120 may be a relaxed, non-relaxed, graded and/or non-graded silicon alloy material.

FIG. 1 also shows substrate layer 120 having interface surface 125 suitable for depositing a transistor device semiconductor channel material onto. FIG. 1 also shows electrically insulating material 130, such as shallow trench isolation (STI), between N-type well 124 and surrounding region 128. Although FIG. 1 shows electrically insulating material 130, various appropriate electronically insulating materials and structures sufficient for electronically isolating an N-type well of a PMOS device (e.g., such as from a P-type well of an NMOS device) are contemplated.

According to embodiments, substrate layer 120 may be a layer of silicon germanium (SiGe) material. Thus, substrate layer 120 may be a layer of graded relaxed silicon alloy material formed by chemical vapor deposition (CVD) epitaxial growth of graded relaxed SiGe in a chamber, such as a semiconductor device fabrication chambers. More specifically, such CVD growth may include placing a substrate base into the chamber, heating the inside of the chamber to a temperature between 500 Celsius and 1,000 Celsius in a hydrogen ambient flow ($H_2$) of between five standard liters per minute (SLM) and 50 SLM, pressurizing the chamber to a pressure between 10 Torr and 200 Torr (e.g., such as either by atmospheric or reduced pressure), flowing into the chamber a silicon precursor (e.g., such as the silicon precursor described herein) at a flow into the chamber of between 50 standard cubic centimeters per minute (SCCM) and 500 SCCM, and slowly increasing a flow of germanium precursor from zero SCCM to a final value sufficient to cause interface surface 125 to have a percentage of germanium between 10 percent and 30 percent germanium. Note that according to embodiments, it is considered that substrate layer 120 may have a concentration of germanium, such as at interface surface 125, of between five percent and 35 percent final concentration germanium. In fact, it is possible to increase the flow of germanium precursor to grow a relaxed graded film of silicon germanium with less than or up to 100 percent germanium at interface surface 125.

Moreover, according to embodiments, the grading rate may be established by a continuous change in grading, a linear change in grading, a non-linear change in grading, and/or a step-grading change of germanium concentration in substrate layer 120. Specifically, for example, the flow of germanium precursor can be increased so that the grading rate increases smoothly and continuously, or so that the grading rate has an abrupt step-grading change of germanium concentration in substrate layer 120 of between one percent and two percent increments every 1,000 to 2,000 angstroms.

Hence, according to embodiments, substrate layer 120 may be graded relaxed silicon germanium material having a grading concentration that increases from zero percent at lower surface 121 to between 10 percent and 30 percent at interface surface 125, at a rate of between five percent and 15 percent increase in germanium per micrometer in depth (e.g., such as in depth related to thickness T2). Graded relaxed silicon germanium, includes graded silicon germanium in a "relaxed" status such as where the alignment of silicon and germanium molecules in the SiGe structure (substrate layer 120) have relatively few dislocations, even where the percentage of Ge grading increases (e.g., such as increasing via smooth or step grading).

Also, according to embodiments, forming substrate layer 120 may include flowing between 50 SCCM and 100 SCCM of HCl during CVD epitaxial growth of graded relaxed silicon germanium. For example, a sufficient amount of HCl may be introduced during formation of substrate layer 120 to increase or improve the planarity of the upper surface, to reduce or control so-called "cross-hatch" that develops during relaxed silicon germanium growth.

Furthermore, according to embodiments, although substrate layer 120 is described above as being formed of graded silicon germanium, substrate layer 120 may be formed by CVD epitaxial growth, ultrahigh vacuum (UHV) CVD epitaxial growth, and/or molecular beam epitaxy (MBE) epitaxial growth of various appropriate silicon alloys (e.g., such as silicon germanium). Thus, for example, substrate layer 120 may be formed by sufficient CVD of various appropriate silicon alloy materials to form a graded relaxed layer of silicon alloy material. Moreover, substrate layer 120 may be formed by an appropriate layer transfer/bonding techniques, such as a substrate SiGe On Insulator (SGOI) process where a relaxed SiGe substrate is prepared by growing SiGe on a bulk substrate by an appropriate process and then transferring a relaxed top layer of the SiGe to a different substrate (e.g., such as to substrate base 110, which may be a silicon oxide wafer) to form substrate layer 120.

Next, according to embodiments, substrate layer 120 may be doped during formation or after formation, such as at interface surface 125 with phosphorous, arsenic, and/or antimony to form N-type well 124 having an electrically negative charge, such as for a PMOS transistor of a CMOS device. To selectively dope interface surface 125, a mask may be placed over the non-selected area or areas to block the introduction of dopant into the non-selected area or areas.

Additionally, FIG. 1 shows channel layer 160 formed on substrate layer 120. For example, after N-type well region 124 is formed on substrate layer 120, a layer of silicon germanium material having a thickness suitable as a channel for a circuit device may be formed on interface surface 125 of substrate layer 120. According to embodiments, channel layer 160 may be deposited by a blanket deposition process, a selective deposition process, and/or an epitaxial deposition process. For example, channel layer 160 may be formed by blanket or selective deposition of a silicon germanium material over N-type well 124 where the blanket or selectively deposited silicon germanium material has a higher concentration of germanium than substrate layer 120 has at interface surface 125.

In particular, channel layer 160, may be an epitaxial or blanket layer of silicon alloy material that may be formed by selective CVD epitaxial or blanket growth of compressive strained silicon germanium. For example, channel layer 160 may be formed by selective or blanket CVD epitaxial growth that includes placing channel substrate layer 120 into a chamber, heating the chamber inside to a temperature between 500 Celsius and 800 Celsius in a hydrogen ambient flow ($H_2$) of between five SLM and 50 SLM, pressurizing the chamber to a pressure between 10 Torr and 200 Torr (e.g., such as pressurizing to atmospheric or reduced pressure), flowing into the chamber a silicon precursor at a flow rate of between 50 SCCM and 500 SCCM, and flowing into the chamber a germanium precursor at a flow rate of up to 100 SCCM (undiluted) to cause channel layer 160 to have a percentage of germanium between 10 percent and 60 percent. Thus, channel layer 160 may be formed, such as with a sufficient percentage of germanium, to cause channel layer 160 to experience compressive strains 162 and 164 due to a lattice spacing of epitaxial layer of silicon alloy material being larger than a lattice spacing of silicon, silicon germanium, or graded silicon germanium substrate layer 120 at interface surface 125. Specifically, formation of channel layer 160 can include flowing a germanium precursor at a rate such that channel layer 160 is an epitaxial layer of silicon germanium material having a thickness T1 of between 10 nanometers and 20 nanometers in thickness. Moreover, it is contemplated that forming channel layer 160 may include introducing between 50 SCCM and 500 SCCM of HCl, such as is described above with respect to forming substrate layer 120. Therefore, channel layer 160 may be formed by an appropriate process and to a thickness sufficient to avoid dislocations, misfits, or threaded dislocations at a second interface defined by where channel layer 160 is connected to interface surface 125 of substrate layer 120.

Furthermore, according to embodiments, although channel layer 160 is described above as being formed of graded silicon germanium, channel layer 160 may be formed by CVD epitaxial growth, UHV CVD epitaxial growth, SGOI, and/or MBE epitaxial growth of various appropriate silicon alloys (e.g., such as silicon germanium).

Also, according to embodiments, a distinction is drawn with respect to the increasing percent or grading concentration of germanium in the graded relaxed silicon germanium substrate material (e.g., such as substrate layer 120 having a percentage of Ge increase, such as a percentage of Ge increasing via smooth or step grading) and the sudden increase in germanium at an interface between a graded relaxed silicon germanium or a silicon substrate material and the channel SiGe (e.g., such as the sudden increase between channel layer 160 which has a greater percentage of Ge at the interface surface 125 than substrate layer 120 by, for example, between 10 percent and 30 percent). Thus, the channel SiGe material (e.g., channel layer 160) may form a coherent alignment with a graded relaxed SiGe or a silicon substrate material (e.g., such as at interface surface 125 of substrate layer 120, where substrate layer 120 may also be in coherent alignment within itself such as along thickness T2), but experience compressive strains 162 and 164 because of a jump in percentage of Ge between the channel layer material and the substrate layer material, at the channel/substrate interface (e.g., such as where channel layer 160 contacts interface surface 125).

Also, during formation, channel layer 160 may be doped, such as by flowing during deposition with, or may be doped after formation, such as with phosphorous, arsenic, and/or antimony to form an N-type channel region having an electrically negative charge, such as for a PMOS device.

Thus, channel layer 160 may be formed by blanket deposition and then have portions removed, such as by patterning (e.g., photolithographic patterning) and etching, to define a channel of a circuit device. For instance, FIG. 1 shows first mask 140 formed on channel layer 160 over interface surface 125 of substrate layer 120. According to embodiments, first mask 140 may be formed of a material such as an etch stop and/or dielectric material, including silicon dioxide ($SiO_2$), a photo resist, or another suitable material for masking an etch process, such as silicon nitride ($Si_3N_4$).

Thus, after first mask 140, such as an etch mask or patterned photo resist layer is formed over a portion of channel layer 160 (e.g., such as a portion corresponding to N-type well 124, implying that the area or cell region above N-type well 124, such as the area above interface surface 125, will incorporate a P-type device), portions of channel layer 160 may be removed, such as by etching with a chlorine-chemistry etchant. In one embodiment, a suitable etchant to pattern channel layer 160 into a channel region may be, for example, a $CF_4$ chemistry. Next, first mask 140, may be removed from over the remaining channel region material.

For example, FIG. 2 is the schematic substrate of FIG. 1 after etching the layer of silicon germanium material, and forming a layer of gate dielectric material and gate electrode conductor material on the etched silicon germanium material. FIG. 2 shows channel region 286. It is to be appreciated that channel region 286, may be doped such as is described above for channel layer 160, by flowing during deposition with or doping after depositing with one of phosphorous, arsenic, and antimony to form an N-type channel region (e.g., such as channel region 286 for a PMOS device) having an electrically negative charge. Specifically, for example, channel region 286 may be doped with between $1.0^{17}$ and $1.0^{18}$ of dopant particles per cubic centimeter of channel material. Thus, region 286 of silicon germanium material may be doped with less than an amount of dopant particles to cause degraded carrier mobility due to excessive impurity scattering, and with enough dopant particles to provide a sufficient PMOS threshold voltage "ON" voltage.

Electronically insulating material 130, such as an STI, may be formed in substrate layer 120 as shown in FIG. 1, may be formed through channel layer 160 as well as into substrate layer 120 (not shown), or may be formed in substrate layer 120 after forming channel region 286 shown in FIG. 2, in order to isolate a channel region from a surrounding region. More particularly, according to embodiments, electrically insulating material 130 may be formed prior to formation of channel layer 160, such as is shown in FIG. 1, or after formation of channel layer 160.

In addition, FIG. 2 shows gate dielectric layer 144 conformally formed on channel region 286 in that the thickness of gate dielectric layer 144 is generally consistent throughout and conforms to the topography of the surface of channel region 286. Gate dielectric layer 144, may be formed of a material such as a material having a relatively high dielectric constant (e.g., "a high K dielectric"), such as a dielectric material having a K greater than or equal to 3.9 and/or greater than or equal to the K of silicon dioxide ($SiO_2$), which may have thickness T4 between two and four nanometers in thickness, formed over channel region 286. Gate dielectric layer 144 may be formed by deposition (e.g., such as by atomic layer deposition (ALD) or CVD) of silicon dioxide ($SiO_2$), hafnium oxide (HfO), hafnium silicate ($HfSiO_4$), hafnium disilicate ($HfSi_4O_7$), zirconium oxide (ZrO), zirconium silicate ($ZrSiO_4$), tantalum oxide ($Ta_2O_5$). It can be appreciated that gate dielectric layer 144 may be formed by chemical vapor deposition (CVD), atomic layer deposition (ALD), blanket deposition, selective deposition, epitaxial deposition, ultrahigh vacuum (UHV) CVD, and/or molecular beam epitaxy (MBE) of an appropriate gate dielectric material to form a gate oxide layer having a thickness T4 of between one nanometer and four nanometers in thickness and having a proper P-type work function for a circuit device silicon germanium channel, such as channel region 286 for a PMOS device. For example, conformal gate dielectric layer 144 may have thickness T4 of two nanometers in thickness and a K equal to or greater than 3.10, or the K for $SiO_2$. Moreover, gate dielectric layer 144 may be formed on channel layer 160, epitaxially, selectively, by blanket deposition, and/or conformally, prior to or after forming channel region 286.

Thus, the difference between the lattice spacing of the material forming channel region 268 and the lattice spacing of the material forming substrate layer 120 at interface surface 125 may define a compressive strain in the directions shown by compressive strains 162 and 164 in channel region 286, which is sufficient to enhance or increase hole mobility in channel region 286 (e.g., such as by at least 50, 80, 90, 100, or 110 percent). Likewise, it can be appreciated that the compressive strain in channel layer 160 may be a bi-axial compressive strain in the direction of compressive strains 162 and 164, as well as in the direction of an arrow pointing away from the page and towards channel region 286 of the cross sectional surface shown in FIGS. 5-7. More particularly, thickness of channel region 286 and percentage of germanium in channel region 286 may be selected as described herein with respect to forming channel layer 160 so that a two dimensional coherent compressive strain is induced in channel region 286 from bonding of channel region 286 to substrate layer 120 at interface surface 125 (e.g., such as a coherent strain caused by the atomic structure of channel region 286 lining up with the atomic structure of interface surface 125, even though channel region 286 has a lattice alignment of a larger lattice spacing than that of interface surface 125).

Consequently, interface surface 125 may have a substrate material of $Si_{1-X}Ge_X$, and channel region 286 may have a channel material of $Si_{1-Y}Ge_Y$, where 10X represents the percentage of germanium in the silicon germanium substrate material at interface surface 125, 10Y represents the percentage of germanium in channel region 286 proximate to interface surface 125, and X is less than Y. For instance, X may be between 0.1 and 0.3, while Y is between 0.2 and 0.6. In some embodiments, Y may be a number between 0.1 and 0.3 larger than X. Moreover, in one embodiment, X may be 0.2 and Y may be 0.5.

Next, a gate electrode for a transistor device may be formed on the gate dielectric layer. For instance, FIG. 2 also shows gate conductor layer 180 conformally formed over gate dielectric layer 144. Gate conductor layer 180 may form part of a gate electrode for a transistor device, such as a PMOS device. In accordance with embodiments, gate conductor layer 180 includes conductor material having a work function in a range between a valence energy band edge and a conduction energy band edge for silicon (Si), such as according to an energy band diagram of a PMOS device having a channel of silicon (Si).

Moreover, according to embodiments, gate conductor layer 180 may be formed of a conductor material having a work function between 4.4 electron volts and 4.7 electron volts with respect to silicon. For instance, electrode conductor layer 180 may have a mid-gap work function for silicon such as $_{ms}$ of between 4.1 and 5.1 where $_{ms}$ is equal to $_m$ (metal work function) minus $_s$ (semiconductor work function). In some embodiments, gate electrode layer 180 is formed of a conductor material having a work function of 4.65 or 4.7 with respect to silicon, but having a work function that is better or higher than mid-gap for silicon germanium. For instance, gate conductor layer 180 may be formed of a conductor material such as titanium nitride (TiN), tantalum nitride (TaN), and/or a silicide.

In addition, it is contemplated that gate conductor layer 180 may be formed by depositing thickness T3 of between 10 angstroms and 20 angstroms in thickness of a conductor material by atomic layer deposition (ALD), chemical vapor deposition (CVD) including a precursor such as tetrakis-dimethyl-amido-titanium (TDMAT) and/or tetrakis-diethyl-amido-titanium (TDEAT), physical vapor deposition (PVD). In one embodiment, thickness T3 may be a thickness of gate oxide (TOX) of 16.5 angstroms.

Thus, for example, it is possible to form a layer of gate electrode conductor material below a layer of gate electrode semiconductor material of a conductor material to relieve electron depletion effects at interface 126 between the gate electrode and gate dielectric layer 144. More particularly, it is possible to form a gate electrode having a layer of semiconductor material over gate conductor layer 180 such that electron depletion effects are alleviated, or cured to an extent that substantially reduces series capacitance at interface 126 due to an insufficient number of P+ doped atoms at interface 126 causing a shortage of free carrier electron when a positive voltage is applied to the gate electrode. For instance, it is possible to select a conductor material and thickness T3 for gate conductor layer 180 and a material and thickness of a semiconductor layer there overlying to decrease electron scattering and increase electron mobility because gate conductor layer 180 abates the potential for electron depletion at interface 126 to an inconsequential amount of electron depletion (e.g., such as the typical electron depletion thickness of between 5 and 20 angstroms for a polysilicon gate electrode).

For example, FIG. 3 shows the substrate of FIG. 2 after forming a layer of gate electrode semiconductor material on the layer of gate electrode conductor material. FIG. 3 shows gate semiconductor layer 190 conformally formed over gate conductor layer 180. Note that although FIGS. 2 and 3 show gate dielectric layer 144, gate conductor layer 180, and gate semiconductor layer 190 formed conformally over channel region 286, various processes for forming layers 144, 180, and/or 190, other than conformally, may be selected. Thus, for example, layers 144, 180 and/or 190 may be formed by processes including by blanket deposition, selective deposition, and/or epitaxial deposition. As mentioned above, channel region 286 may be disposed on interface surface 125 between regions of electronically insulating material 130 to form a planar surface.

According to embodiments, gate semiconductor layer 190 may be formed of various appropriate semiconductor materials such as polysilicon, crystal silicon, and/or various other appropriate gate semiconductor materials. Likewise, forming gate semiconductor layer 190 may include doping such as by flowing during forming with, or doping after forming with one of boron and aluminum to form a P-type gate electrode having an electrically positive charge (e.g., see PMOS device electrode conductor 480 and semiconductor 490 of FIG. 5).

It is contemplated that gate semiconductor layer 190 may have thickness T6 and conductor layer 180 may have thickness T3 to cause a transistor formed in channel region 286 (e.g., see FIG. 5) to have a threshold "ON" voltage of between 0.1 and 0.5 volts, or a threshold "ON" voltage of between 0.2 and 0.3 volts.

Figure 4:
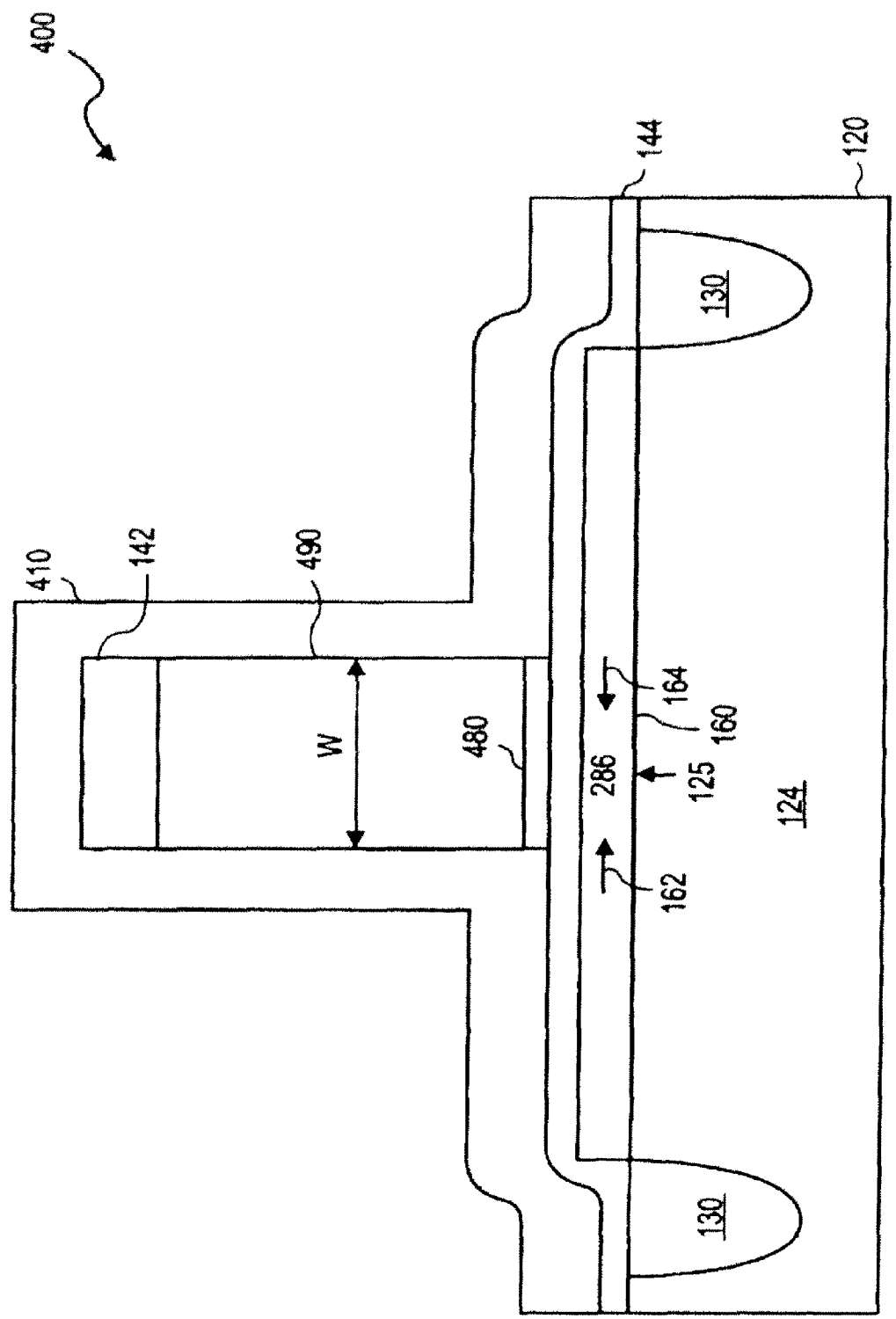
FIG. 4 shows the substrate of FIG. 3 after etching the layer of gate electrode conductor and semiconductor materials, and forming a layer of spacer material on the etched gate electrode materials and the layer of gate dielectric material.

Next, portions of gate semiconductor layer 190 and/or gate conductor layer 180 may be removed such as by patterning and etching to define a gate electrode. For instance, FIG. 3 shows hard mask 142 formed on gate semiconductor layer 190. Hard mask 142 may be formed of silicon nitride ($Si_3N_4$), or other materials mentioned above for forming first mask 140. After forming hard mask 142, in some embodiments, a portion of gate semiconductor layer 190 and a corresponding portion of gate conductor layer 180 is removed, or etched away, e.g., using layer 180 as an etch stop. For example, FIG. 4 shows the substrate of FIG. 3 after etching the layer of gate electrode conductor and semiconductor materials, and forming a layer of spacer material on the etched gate electrode materials and the layer of gate dielectric material. FIG. 4 shows gate semiconductor 490 and gate conductor 480 after etching or removal of portions of gate semiconductor layer 190 and gate conductor layer 180, such as by patterning with an etching around hard mask 142. Additionally, according to some embodiments, removal of portions of gate semiconductor layer 190 and gate conductor layer 180 may include removing portions, such as corresponding portions, of gate dielectric layer 144 (e.g., such as etching gate dielectric layer 144 to have the same width W as gate conductor 480 and gate semiconductor 490, according to hard mask 142).

FIG. 4 also shows spacer material 410 conformally formed over hard mask 142, gate semiconductor 490, gate conductor 480 and gate dielectric layer 144. Spacer material 410 may include silicon nitride ($Si_3N_4$), silicon dioxide ($SiO_2$), and/or various other appropriate semiconductor device spacer materials. Portions of spacer material 410 may then be removed, or etched so as to form spacers superadjacent to gate semiconductor 490 and gate conductor 480.

Figure 5:
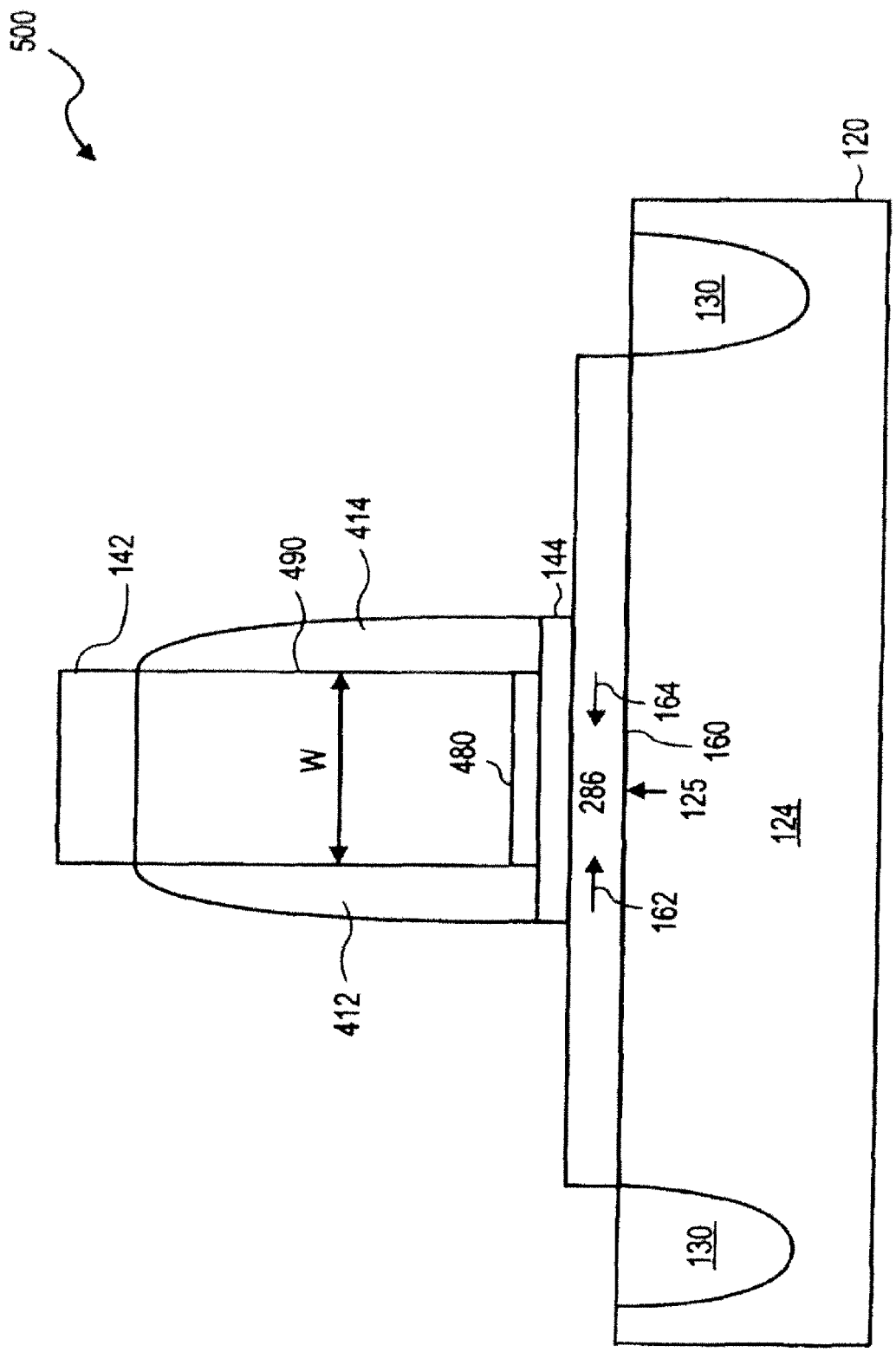
FIG. 5 shows the substrate of FIG. 4 after etching portions of the layer of spacer material and gate dielectric material.

For instance, FIG. 5 shows the substrate of FIG. 4 after etching portions of the layer of spacer material and gate dielectric material. FIG. 5 shows spacers 412 and 414 formed on surfaces of gate semiconductor 490 and gate conductor 480. Moreover, according to embodiments, removal of, or etching of portions of spacer material 410 may include removal of or etching of portions of gate dielectric layer 144, such as to form gate dielectric 444. Optionally, if gate dielectric layer 144 is etched during formation of gate conductor 480 and gate semiconductor 490 as described above, spacers 412 and 414 may be formed on side surfaces of the resulting gate dielectric having width W.

Figure 6:
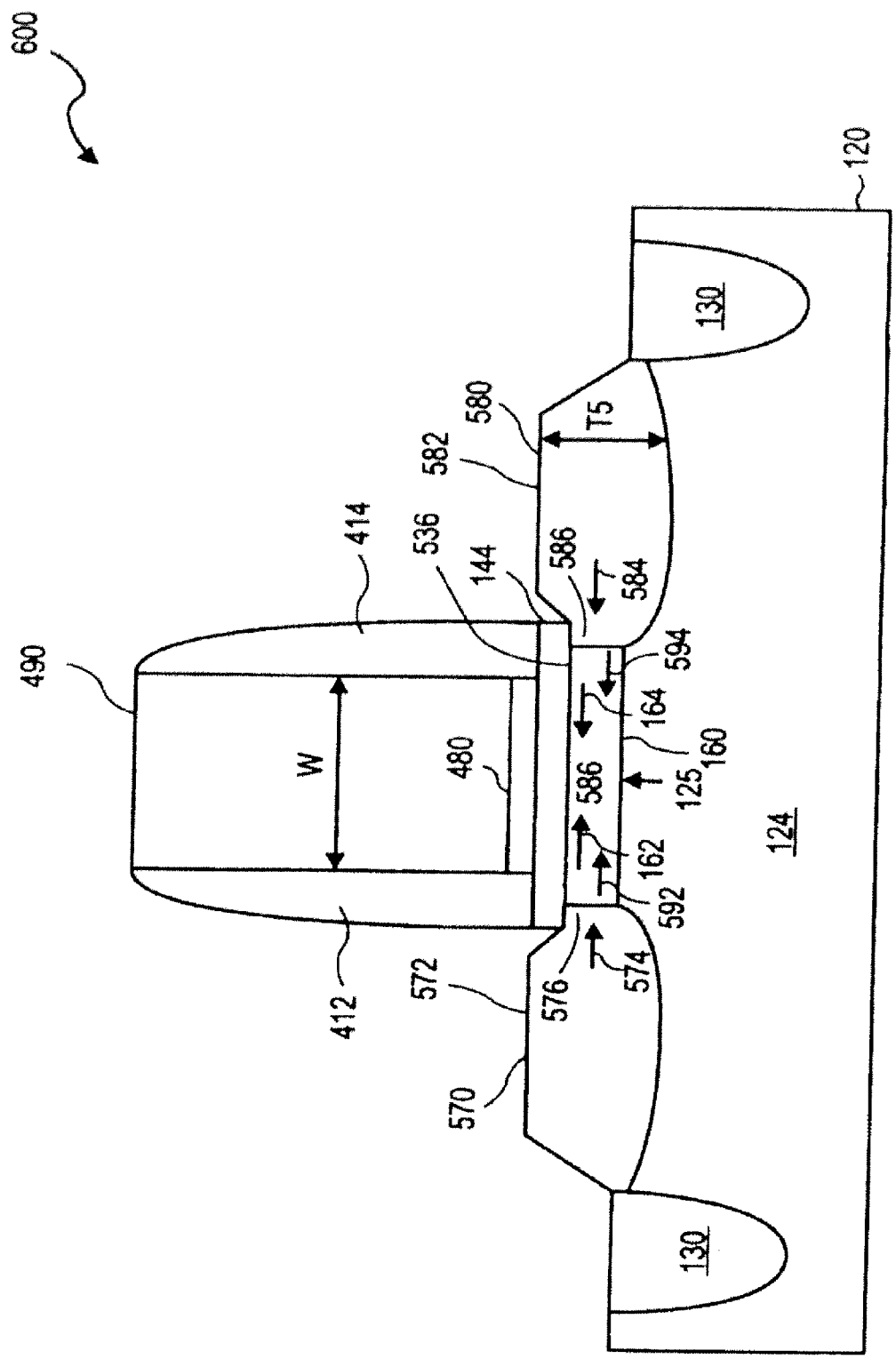
FIG. 6 shows the substrate of FIG. 5 after forming a first and second junction region in the silicon germanium material.

After forming gate dielectric 444, gate semiconductor 490 and/or gate conductor 480, junction regions may be formed in channel region 286. For example, FIG. 6 shows the substrate of FIG. 5 after forming a first and second junction region in the silicon germanium material. FIG. 6 shows first junction region 570 and second junction region 580 formed in channel region 286 to create channel 586, and adjacent to gate dielectric 444, gate conductor 480, and gate semiconductor 490. For instance, first junction region 570 and second junction region 580 may be formed by depositing a sufficient thickness of silicon germanium material, such as thickness T5, where the silicon germanium material has a larger lattice spacing than a lattice spacing of circuit substrate 120. Thus, the larger lattice spacing of first junction region 570 and/or second junction region 580 may cause compressive strains 592 and 594 in channel 586. For instance, compressive strains 592 and 594 may be in a range between 0.5% compression and 2.5% compression in a channel of silicon germanium material.

More particularly, first junction region 570 and second junction region 580 may be formed by removing a first and second portion of channel region 286 adjacent to an under spacers 412 and 414, such as including by removing portions of channel region 286 by a recess etch process that existed where indicated by portion 576 and 586. Next, material having a lattice spacing larger than substrate layer 120 and/or larger than a lattice spacing of channel 586 may be deposited where the recess etching occurred. Thus first junction region 570 having a first junction region surface 572 and second junction region 580 to have a second junction region surface 582, may be formed where the junction region surfaces are in a non-planar relationship with channel surface 536. More particularly, silicon germanium junction material having a lattice spacing larger than semiconductor layer 120 may be deposited by selective epitaxial deposition to form first junction region 570 and second junction region 580 as shown in FIG. 6.

In addition, it is contemplated that thickness T1 may be selected such that channel 586 experiences a compressive strain caused by a difference in the lattice spacing of the material of circuit substrate 120 proximate to the junction regions being smaller than a lattice spacing of either first junction region 570 and/or second junction region 580 proximate to channel 586. Therefore, such a difference in lattice spacing may cause a hydrostatic pressure compressive strain on channel 586, such as is shown by hydrostatic pressures 574 and 584 causing hydrostatic compressive strains 592 and 594. As shown in FIG. 6, channel 586 may experience hydrostatic compressive strains 592 and 594 as well as compressive strains 162 and 164, where each strain may be contributing to the contracting, squeezing, or inward pressure applied on region 586.

Likewise, it is to be appreciated that forming first junction region 570 and second junction region 580 may include flowing during depositing with, or doping after depositing with one of boron and aluminum to form a P-type first junction region 570 and second junction region 580, both having an electrically positive charge. In fact, it can be appreciated that first junction region 570 and second junction region 580 may be doped with a sufficient amount of boron or aluminum to decrease resistivity, reduce shunt resistance, and/or increase the drive current of first junction region and/or second junction region 580.

It is also contemplated that first junction region 570 and second junction region 580 may be formed by depositing a silicon germanium junction material at junction region locations while flowing diborane during deposition. Hard mask 142 may or may not be removed, such as by removing hard mask 142 prior to, during, or after forming channel 586; and/or prior to, during, or after forming junction regions 570 and 580. Consequently, according to embodiments, the structure shown in FIG. 6 may be a PMOS transistor device portion of a CMOS device.

Notably, a PMOS device formed as described above, such as PMOS device 600 may include channel 586 that is a layer of $Si_{1-Y}Ge_Y$ material on an area of a $Si_{1-X}Ge_X$ material defining interface surface 125 of substrate layer 120, where substrate layer 120 is a graded relaxed silicon germanium material including N-type well 124 and a corresponding P-type well (P-type well not shown). Thus, channel 586 may be under compressive strains 162 and 164 caused by a lattice spacing of the $Si_{1-Y}Ge_Y$ material being larger than a lattice spacing of the $Si_{1-X}Ge_X$ material at interface 125. Likewise, according to embodiments, substrate layer 120 may have a percentage of germanium at interface surface 125 between 10% and 35% and the percentage of germanium in channel 586 may be greater than the percentage of germanium in substrate layer 120 at interface 125. Thus, it is to be appreciated that X may be between 0.1 and 0.3 at interface 125 while Y may be between 0.2 and 0.6 at interface 125, such as to cause a coherent compressive strain in channel 586. For instance, X may be in a range between 0.1 and 0.3 at interface 125, and Y may be greater than X by an amount in a range between 0.1 and 0.3 (e.g., thus channel 586 may have a percentage of germanium that is 10% to 30% greater than the percentage of germanium in substrate layer 120 at interface 125).

Figure 7:
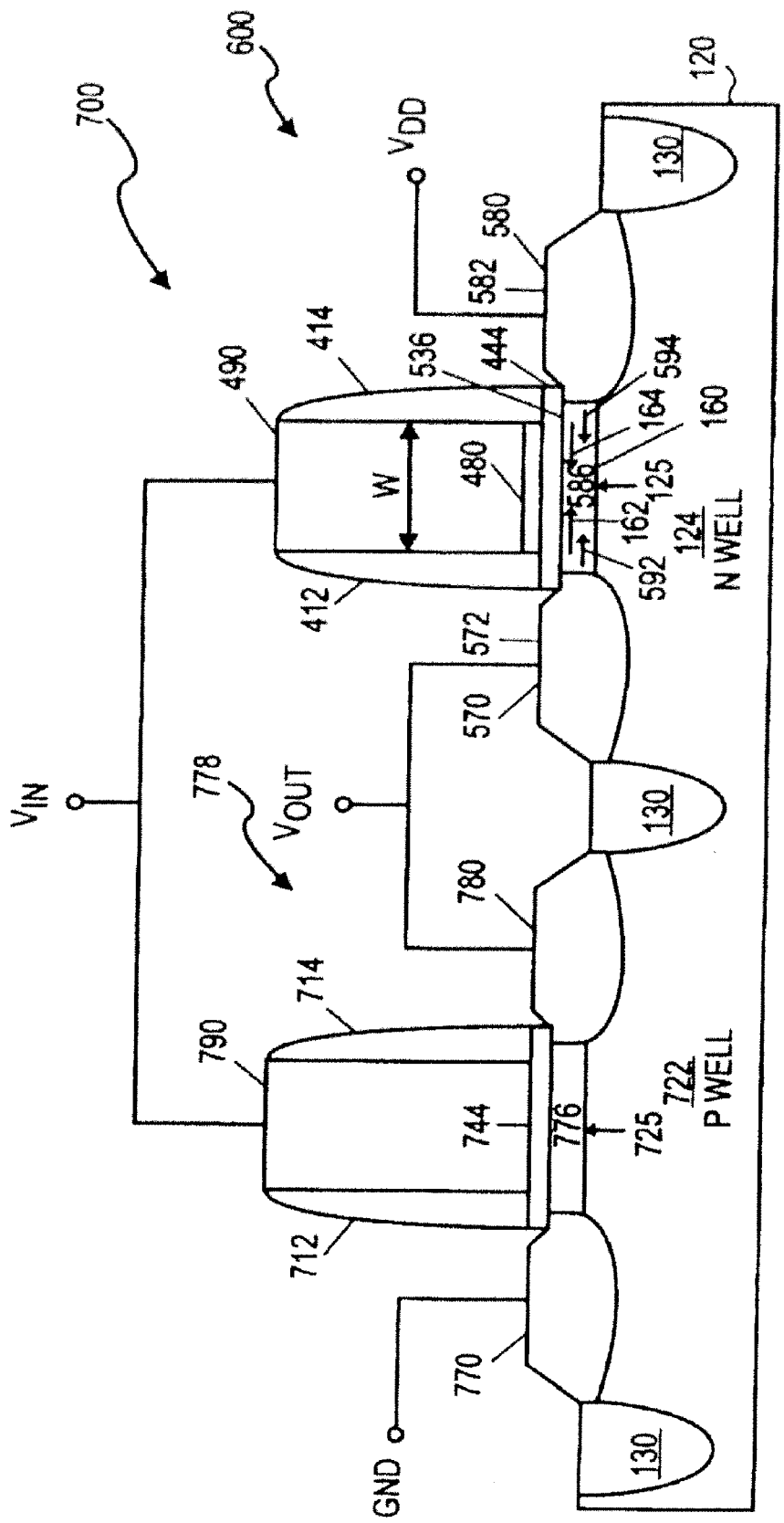
FIG. 7 shows a representative CMOS structure.

FIG. 7 shows a representative CMOS structure. FIG. 7 shows CMOS structure 700 having PMOS device 600, such as a PMOS as described above, connected to NMOS device 778 in typical fashion. As such, it can be appreciated that substrate layer 120 may include P-type well 722 related to N-type well 124 for forming CMOS device 700, such that P-type well 722 is part of NMOS transistor device 778 formed on a second area of substrate layer 120 defining different second interface surface 725 of substrate layer 120 adjacent to N-type well 124. Specifically, for instance, NMOS transistor 778 may be formed adjacent to PMOS transistor 600 such as by having NMOS transistor 778 electronically isolated from PMOS transistor 600 by electrically insulating material 130 as described herein. Moreover, NMOS transistor 778 may include channel region 776, gate dielectric 774, N-type gate electrode 790, N-type junctions 770 and 780, and spacers 712 and 714.

In the foregoing specification, the invention has been described with reference to specific embodiments thereof. However, it will be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. An apparatus comprising:
   a transistor device channel comprising a silicon germanium (SiGe) material on a circuit substrate;
   a gate dielectric for the transistor device, the gate dielectric comprising a material having a dielectric constant greater than a dielectric constant of silicon dioxide; and
   a gate electrode over the gate dielectric, the gate electrode comprising a conductor material and a layer of semiconductor material over the conductor material, wherein the conductor material is one of a titanium nitride (TiN), a tantalum nitride (TaN), and a silicide, and wherein the semiconductor material of the gate electrode is doped with one of boron and aluminum to form a P-type gate electrode having an electrically positive charge.

2. The apparatus of claim 1, wherein a hydrostatic pressure compressive strain is induced in the SiGe material by a lattice spacing of the circuit substrate material being smaller than a lattice spacing of at least one junction region.

3. The apparatus of claim 2, wherein the substrate is silicon (Si), and wherein a bi-axial compressive strain in the channel is caused by a lattice spacing of the SiGe material being larger than a lattice spacing of the substrate material defining an interface surface of the substrate.

4. The apparatus of claim 1, wherein the channel is a layer of a $Si_{1-Y}Ge_Y$ material on an area of a $Si_{1-X}Ge_X$ material defining an interface surface of a substrate of graded relaxed silicon germanium material;
   wherein the layer of $Si_{1-Y}Ge_Y$ material is under a compressive strain caused by a lattice spacing of the $Si_{1-Y}Ge_Y$ material being larger than a lattice spacing of the $Si_{1-X}Ge_X$ material at the interface surface.

5. The apparatus of claim 4, wherein X is in a range between 0.1 and 0.3 at the interface surface, and Y is greater than X by a range between 0.1 and 0.3.

6. The apparatus of claim 1, wherein the SiGe material of the channel is doped with one of phosphorous, arsenic, and antimony to form an N-type channel region having an electrically negative charge.

7. The apparatus of claim 1, wherein the SiGe material of the channel comprises a selective chemical vapor deposition (CVD) epitaxial blanket growth of compressive strained SiGe material.

8. The apparatus of claim 1, wherein the conductor material of the gate electrode has a work function between 4.4 electron volts and 4.7 electron volts with respect to silicon.

9. The apparatus of claim 8, further comprising a first junction region and a second junction region in the channel adjacent to the gate electrode, wherein the first junction region and the second junction region include a sufficient thickness of SiGe material having a larger lattice spacing than a lattice spacing of the substrate material to cause a compressive strain in the channel in a range of between 0.5% compression and 2.5% compression.

10. The apparatus of claim 9, wherein the first junction region and second junction region comprise a material doped with one of boron and aluminum to form a P-type junction material having an electrically positive charge.

11. An apparatus comprising:
a transistor device channel comprising a silicon germanium (SiGe) material on a circuit substrate;
a gate dielectric for the transistor device, the gate dielectric comprising a material having a dielectric constant greater than a dielectric constant of silicon dioxide; and
a gate electrode over the gate dielectric, the gate electrode comprising a conductor material and a layer of semiconductor material over the conductor material, wherein the conductor material comprises titanium nitride (TiN), and wherein the semiconductor material of the gate electrode is doped with one of boron and aluminum to form a P-type gate electrode having an electrically positive charge.

12. The apparatus of claim 11, wherein a hydrostatic pressure compressive strain is induced in the SiGe material by a lattice spacing of the circuit substrate material being smaller than a lattice spacing of at least one junction region.

13. The apparatus of claim 12, wherein the substrate is silicon (Si), and wherein a bi-axial compressive strain in the channel is caused by a lattice spacing of the SiGe material being larger than a lattice spacing of the substrate material defining an interface surface of the substrate.

14. The apparatus of claim 11, wherein the conductor material of the gate electrode has a work function between 4.4 electron volts and 4.7 electron volts with respect to silicon.

15. The apparatus of claim 14, further comprising a first junction region and a second junction region in the channel adjacent to the gate electrode, wherein the first junction region and the second junction region include a sufficient thickness of SiGe material having a larger lattice spacing than a lattice spacing of the substrate material to cause a compressive strain in the channel in a range of between 0.5% compression and 2.5% compression.

16. An apparatus comprising:
a transistor device channel comprising a silicon germanium (SiGe) material on a circuit substrate;
a gate dielectric for the transistor device, the gate dielectric comprising a material having a dielectric constant greater than a dielectric constant of silicon dioxide; and
a gate electrode over the gate dielectric, the gate electrode comprising a conductor material and a layer of semiconductor material over the conductor material, wherein the conductor material comprises tantalum nitride (TaN), and wherein the semiconductor material of the gate electrode is doped with one of boron and aluminum to form a P-type gate electrode having an electrically positive charge.

17. The apparatus of claim 16, wherein a hydrostatic pressure compressive strain is induced in the SiGe material by a lattice spacing of the circuit substrate material being smaller than a lattice spacing of at least one junction region.

18. The apparatus of claim 17, wherein the substrate is silicon (Si), and wherein a bi-axial compressive strain in the channel is caused by a lattice spacing of the SiGe material being larger than a lattice spacing of the substrate material defining an interface surface of the substrate.

19. The apparatus of claim 16, wherein the conductor material of the gate electrode has a work function between 4.4 electron volts and 4.7 electron volts with respect to silicon.

20. The apparatus of claim 19, further comprising a first junction region and a second junction region in the channel adjacent to the gate electrode, wherein the first junction region and the second junction region include a sufficient thickness of SiGe material having a larger lattice spacing than a lattice spacing of the substrate material to cause a compressive strain in the channel in a range of between 0.5% compression and 2.5% compression.

* * * * *